Dec. 20, 1955 C. G. RINGWALL 2,727,989
RADIO NOISE FILTER
Filed Sept. 29, 1950
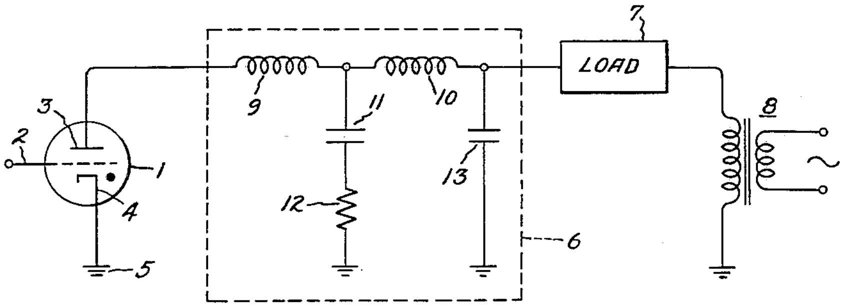
Inventor:
Carl G. Ringwall,
by Claude A. Mott
His Attorney.

United States Patent Office 2,727,989

Patented Dec. 20, 1955

2,727,989

RADIO NOISE FILTER

Carl G. Ringwall, Schenectady, N. Y., assignor to General Electric Company, a corporation of New York Application September 29, 1950, Serial No. 187,460

2 Claims. (Cl. 250—27)

This invention relates to electrical filters and more particularly to filters of the type adapted to reduce radio noise levels.

In many applications, radio noise is very troublesome and it is particularly desirable that such noise be eliminated or reduced to a minimum. One instance in which radio noise is troublesome, is in a circuit employing a thyratron tube. As is known, the plate of a thyratron is usually in series with the load and the source of voltage to the thyratron plate. If a capacitor is connected in shunt between this series circuit and ground, it will be fully charged by the source of voltage connected to the plate, and at the instant the tube fires, the voltage on the capacitor will be discharged through the tube thus resulting in a very high surge of current through the tube. This large surge, even though its duration is of the order of 20 microseconds, may result in spattering of the cathode material. Such a large surge also results in the generation of further radio noise in the thyratron, since the addition of the capacitor cannot attenuate radio noise due to the low source impedance. Therefore, the net result of employing a capacitor in such a circuit is to increase radio noise at the plate lead and to increase the detrimental effects on the tube.

An inductance may of course be added between the condenser and the thyratron plate to cut down the magnitude of the current surge to the maximum rated current of the tube. However, a noise filter section consisting of only one inductance and one capacitor requires excessively large components to attain the desired attenuation. In the lower frequency spectrum, .15 to .28 megacycles, radio noise voltages of 250,000 microvolts are common, and in order to satisfy radio noise specifications, the order of magnitude of radio noise at the filter output must be below 50 microvolts. This requires a filter with an insertion loss of at least 75 db in this frequency spectrum. To obtain this insertion loss at .16 megacycle for example with a one section filter, would require an extremely large inductance and capacitor. The resulting filter would be large, have a high D.-C. resistance and would have an appreciable impedance at power frequencies.

By adding another section, the total inductance and capacitance required for a given insertion loss can be greatly reduced. The use of two sections however results in an undesirable oscillatory condition which means higher radio noise levels on the output of the filter than on the input.

It is an object of this invention to provide a radio noise filter which overcomes the foregoing disadvantages, offers a tremendous improvement in the attenuation of radio noise levels, and yet is simple and inexpensive.

It is a further object of my invention to provide a two section filter which markedly attenuates the harmonics which extend into the radio frequency spectrum.

Briefly, my invention comprises the simple addition of a resistor in one of the sections of a standard LC filter, this simple change being responsible for a surprisingly astonishing reduction in radio noise due to the suppression of oscillations which would normally be the cause of the generation of radio frequency harmonics in the input section.

My invention will be more fully understood by referring now to the accompanying schematic representation illustrating my novel filter.

Looking now at the drawing, I have shown a typical thyratron circuit in which my noise filter is employed. This comprises a thyratron tube 1 having an input grid 2, a plate 3, and a cathode 4 which is grounded at 5. As shown, the plate of the thyratron 1 is connected in series with a filter 6, load 7 and a source of power generally designated as 8. Broadly, the circuit thus far described is conventional and well known.

Looking now at the filter 6 per se, it will be seen to comprise an inductance 9 serially connected to another inductance 10 both of which inductances are in series between the thyratron plate and the load. Between the two inductances and ground there is connected a shunt capacitor 11 and a resistance 12. At the junction of inductance 10 and load 7 there is connected a second shunt capacitor 13 to ground. From the standpoint of attenuation alone, there is no optimum relation between the inductance and capacitors. However, for a given total inductance and capacity, maximum attenuation is attained when the total inductance and capacity is divided up equally between the two sections.

The resistor 12 plays a very important part with respect to the lower frequency spectrum and its function can perhaps best be explained by considering the operation of the circuit. Let us assume that the source 8 has charged the capacitors 11 and 13 and the thyratron then fires. When this occurs, the filter circuits will resonate at their characteristic frequencies. Were only one LC section used, this circuit would have one resonant frequency. This frequency could be kept low enough so that the fundamental and any resultant harmonics would not extend up into the R. F. frequencies. When two LC sections are used however, there will be two resonant frequencies superimposed on each other. The result will be a distorted wave giving rise to harmonics extending up into the radio frequency spectrum. This will result in very high radio noise at the output of the filter 6. In some cases the noise output will be greater than the input. The function of the resistor 12 is to attenuate the secondary frequency to a point where its effect is negligible, the net result being a slightly distorted oscillation at the predominant frequency. The predominant frequency is the lower frequency of the two, and its fundamental frequency and harmonics can be very readily kept below the desired frequency spectrum.

According to my invention, the connection of the small resistor 12, preferably in the order of two to five ohms, in series with the first capacitor to ground results in an amazing attenuation of the harmonics generated as a result of the two oscillations and has made it possible to use a two section filter in circuits such as that shown, yet with negligible attenuation due to the filter itself.

While a particular embodiment of my invention has been illustrated and described, modifications thereof will readily occur to those skilled in the art. It should be understood therefore that the invention is not limited to the particular arrangement disclosed but that the appended claims are intended to cover all modifications which do not depart from the true spirit and scope of the invention.

I claim:

1. In combination, a source of alternating electric current supply having one terminal grounded, a load circuit connected to said supply source and including in series circuit relation an electrical load device and a gaseous electric discharge device having an anode, a cathode and a control grid, said anode and cathode being connected in said load circuit and said cathode being grounded; and electric filtering means interposed between said anode and said load device consisting of a pair of inductive reactances connected in series circuit relation in said load circuit, separate capacitors connected from each terminal of one of said inductive reactances to ground, and a resistor connected in series circuit relation with one of said capacitors between said one inductive reactance and ground.

2. In combination, a cource of alternating electric current supply having one terminal grounded, a load circuit connected to said supply source and including in series circuit relation an electrical load device and a gaseous electric discharge device having an anode, a cathode and a control grid, said anode and cathode being connected in said load circuit and said cathode being grounded; and electric filtering means interposed between said anode and said load device consisting of a pair of inductive reactances connected in series circuit relation in said load circuit, separate capacitors connected between the junction of said inductive reactances and ground and between the junction of said load device with one of said reactances and ground, and a resistor connected in series circuit relation with the first said capacitor between said first-named junction and ground.

References Cited in the file of this patent

UNITED STATES PATENTS

| | | |
|---|---|---|
| 1,840,776 | Houck | Jan. 12, 1932 |
| 1,986,627 | Edwards | Jan. 1, 1935 |
| 2,035,457 | Blumlein | Mar. 31, 1936 |
| 2,095,742 | Haller | Oct. 12, 1937 |
| 2,113,220 | Power | Apr. 5, 1938 |
| 2,590,098 | Hagen | Mar. 25, 1952 |